(12) United States Patent
Liang

(10) Patent No.: US 10,562,671 B2
(45) Date of Patent: Feb. 18, 2020

(54) PACKING CONTAINER FOR DISPLAY PANEL

(71) Applicants: HKC Corporation Limited, Shenzhen (CN); Chongqing HKC Optoelectronics Technology Co., Ltd., Chongqing (CN)

(72) Inventor: Shuozhen Liang, Chongqing (CN)

(73) Assignees: HKC Corporation Limited, Shenzhen (CN); Chongqing HKC Optoelectronics Technology Co., Ltd., Chongqing (CN)

(*) Notice: Subject to any disclaimer, the term of this patent is extended or adjusted under 35 U.S.C. 154(b) by 124 days.

(21) Appl. No.: 15/562,838

(22) PCT Filed: Jun. 23, 2017

(86) PCT No.: PCT/CN2017/089667
§ 371 (c)(1),
(2) Date: Sep. 28, 2017

(87) PCT Pub. No.: WO2018/214213
PCT Pub. Date: Nov. 29, 2018

(65) Prior Publication Data
US 2019/0119002 A1    Apr. 25, 2019

(30) Foreign Application Priority Data

May 26, 2017  (CN) .......................... 2017 1 0395477

(51) Int. Cl.
*B65D 25/10* (2006.01)
*B65D 81/02* (2006.01)
*B65D 85/30* (2006.01)
*H01L 51/52* (2006.01)
*H05K 1/14* (2006.01)
*G02F 1/1345* (2006.01)

(52) U.S. Cl.
CPC .......... *B65D 25/10* (2013.01); *B65D 81/022* (2013.01); *B65D 85/30* (2013.01); *B65D 2585/86* (2013.01); *G02F 1/13452* (2013.01); *H01L 51/5203* (2013.01); *H05K 1/147* (2013.01)

(58) Field of Classification Search
CPC ...... B65D 25/10; B65D 81/02; B65D 81/022; B65D 81/05; B65D 85/30; B65D 85/48; B65D 2585/86; G02F 1/1333; G02F 1/133308; G02F 1/13452; H01L 51/5203; H05K 1/147
USPC ................................... 206/449, 454; 349/58
See application file for complete search history.

(56) References Cited

U.S. PATENT DOCUMENTS 8,939,289 B2 * 1/2015 Kuo ...................... B65D 85/30
206/454
9,038,824 B2 * 5/2015 Zhao ...................... B65D 81/02
206/453

(Continued)

*Primary Examiner* — Bryon P Gehman
(74) *Attorney, Agent, or Firm* — Wang Law Firm, Inc.

(57) ABSTRACT

A packing container for accommodating a display panel is described. The packing container includes a packing main body having a receiving recess, which includes a first receiving zone and a second receiving zone, and a limiting element disposed on the second receiving zone, wherein the limiting element and the sidewall of the second receiving zone form a limiting accommodating space to constrain and accommodate a circuit board of the display panel.

8 Claims, 15 Drawing Sheets

(56) References Cited

U.S. PATENT DOCUMENTS

| | | | |
|---|---|---|---|
| 9,258,909 B2* | 2/2016 | Zhao | B65D 81/133 |
| 9,266,666 B2* | 2/2016 | Yue | B65D 25/10 |
| 9,329,418 B2* | 5/2016 | Hu | G02F 1/133308 |
| 9,533,815 B2* | 1/2017 | Hu | B65D 81/05 |

* cited by examiner

PACKING CONTAINER FOR DISPLAY PANEL

CROSS-REFERENCE TO RELATED APPLICATION

This application claims the benefit of China Application No. 201710395477.8, filed on May 26, 2017, the disclosure of which is incorporated herein in its entirety by reference.

BACKGROUND OF THE INVENTION

1. Field of the Invention

The present invention relates to the field of packing container, especially to the packing container for display panels.

2. Description of the Related Art

A display panel intermediate product delivered by the manufacturer generally includes a display panel main body, a circuit board, and a flexible printed circuit board, wherein the flexible printed circuit board is configured to couple the display panel main body to the circuit board. Usually, the intermediate product, the display panel, is placed in a packing container during transportation. However, it is very likely that the circuit board in the packing container would suffer violent vibration during transportation which may generate stressing forces and cause damages on the flexible printed circuit board, thereby giving rise to concerns about abnormal issues of the display panel main body.

SUMMARY OF THE INVENTION

The present invention provides a packing container for accommodating a display panel with decreased movable space, which effectively reduces the forces of a circuit board exerted on a flexible printed circuit board of the display panel, and thereby the damage rate of the flexible printed circuit board during transportation is decreased.

The present invention provides a packing container for accommodating a display panel, including:
a packing main body having a receiving recess, wherein the receiving recess includes a first receiving zone, which is configured for accommodating a display panel main body, and a second receiving zone, which is configured for accommodating the circuit board and the flexible printed circuit board;
a limiting element disposed on the second receiving zone;
wherein the limiting element and a sidewall of the second receiving zone jointly form a limiting accommodating space to constrain the circuit board.

In the packing container for accommodating the display panel in accordance with the present invention, the limiting element includes:
a first limiting component disposed on a sidewall of the second receiving zone;
a second limiting component disposed on the sidewall of the second receiving zone, wherein the first limiting component is disposed opposite to the first limiting component to form the limiting accommodating space.

In the packing container for accommodating the display panel in accordance with the present invention, one end of each of the first limiting component and the second limiting component away from the sidewall includes a bending portion bending toward the circuit board.

In the packing container for accommodating the display panel in accordance with the present invention, the first limiting component and the second limiting component are engaged with the sidewall of the second receiving zone.

In the packing container for accommodating the display panel in accordance with the present invention, at least two first slots are arranged on the sidewall of the second receiving zone, wherein the ends of each of the first and the second limiting components are engaged into the first slots.

In the packing container for accommodating the display panel in accordance with the present invention, at least two second slots are arranged on a bottom surface of the second receiving zone, wherein the base portions of the first limiting component and the second limiting component are engaged with the second slots.

In the packing container for accommodating the display panel in accordance with the present invention, the first limiting component and the second limiting component are rotated to be installed on the sidewall of the second receiving zone.

In the packing container for accommodating the display panel in accordance with the present invention, a rotation axle is arranged on the sidewall of the second receiving zone, and a rotation ring is disposed on each of the first and the second limiting components, wherein the rotation rings are sleeved on the rotation axle.

In the packing container for accommodating the display panel in accordance with the present invention, a fixing hole and a fixing element are disposed on the rotation ring, wherein the fixing element is inserted through the fixing hole and pressed against the rotation axle to fix the relative positions of the first limiting component or the second limiting component and the rotation axle.

In the packing container for accommodating the display panel in accordance with the present invention, one or more recess portions are disposed with an interval therebetween on a sidewall of the first receiving zone.

In the packing container for accommodating the display panel in accordance with the present invention, the limiting element is disposed on the second receiving zone of the receiving recess, wherein the limiting element and the sidewalls of the second receiving zone form the limiting accommodating space to constrain the circuit board, which effectively decreases the movable space of the circuit board in the packing container and reduces the stressing force of the circuit board applied on the flexible printed circuit board and reduces the damage rate of the flexible printed circuit board during the transportation. Therefore, the production yield of the display panel is improved.

BRIEF DESCRIPTION OF THE DRAWINGS

In order to illustrate a technical solution according to embodiments of the present invention more clearly, drawings to be used in the description of the embodiments will be briefly set forth in the following. It is obvious that the drawings in the following description are only related to some embodiments of the present invention. Those ordinarily skilled in the art may obtain other embodiments according to these drawings, without any inventive work.

DESCRIPTION OF THE PREFERRED EMBODIMENTS

Figure 1:
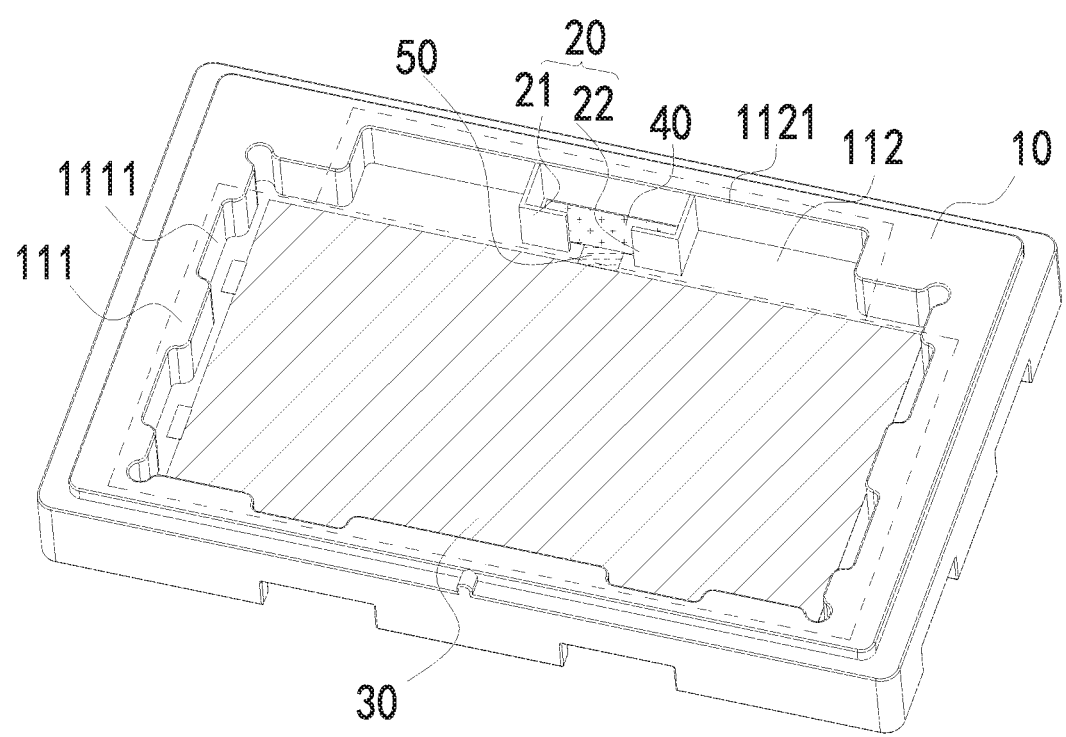
FIG. 1 is a schematic diagram of an embodiment showing a structure of the packing container for accommodating a display panel.

In the following, embodiments in accordance with the present invention will be described clearly and fully accompanying with the drawings. It is apparent that the accompanying drawings in the following description show only some embodiments of the present disclosure. For those skilled in the art, other accompanying drawings may be obtained according to these accompanying drawings without any creative work.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation, do not limit the scope of the invention.

Figure 2:
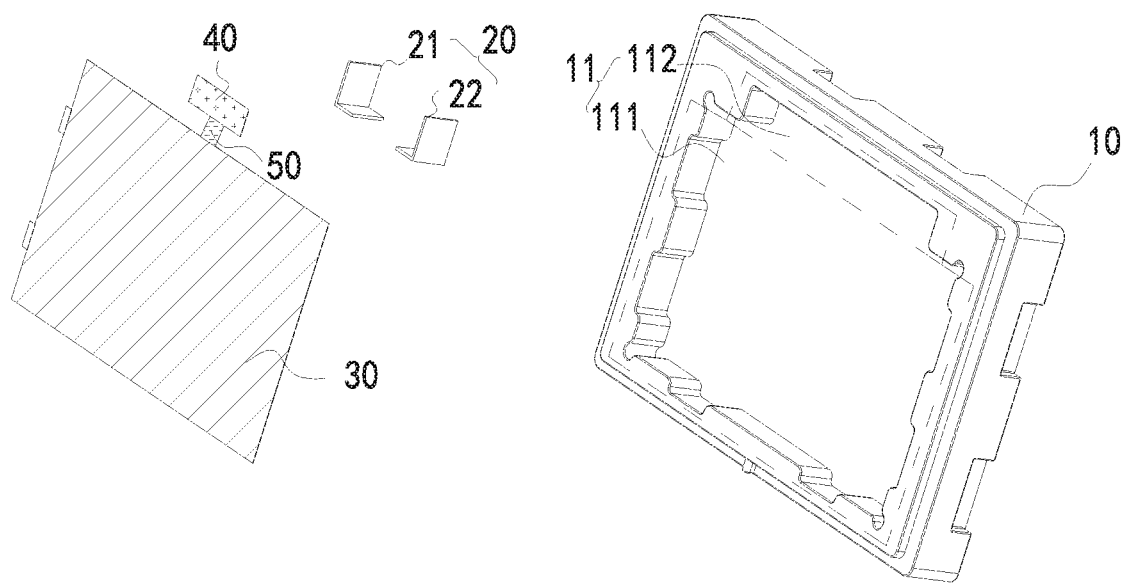
FIG. 2 is an explode view showing the packing container in FIG. 1.

Referring to FIG. 1 and FIG. 2, which are the schematic diagram and the corresponding explode view of this embodiment showing a structure of a packing container for accommodating a display panel. In this embodiment, the display panel includes a display panel main body 30, a circuit board 40, and a flexible printed circuit board 50, wherein the flexible printed circuit board 50 is configured to connect the display panel main body 30 to the circuit board 40. In this invention, the chip on film technology can be applied on the flexible printed circuit board 50. The display panel here is still an intermediate product, and, during the transportation, stressing forces thereby might be generated between the circuit board 40 and the flexible printed circuit board 50 and damage the flexible printed circuit board 50, which gives rise to concerns about abnormal issues of the display panel. Therefore, the present embodiment provides a packing container for accommodating the display panel to avoid the cause of the damage.

The packing main body 10 includes a receiving recess 11, which includes a first receiving zone 111 and a second receiving zone 112.

The first receiving zone 111 is configured to accommodate the display panel main body 30. For easier putting in or taking out the display panel main body 30, one or more recess portions 1111 are disposed with an interval therebetween on the sidewall of the first receiving zone 111.

The second receiving zone 112 is configured to accommodate the circuit board 40 and the flexible printed circuit board 50. A limiting element 20 may also be disposed on the second receiving zone 112. The limiting element 20 and the sidewall 1121 of the second receiving zone 112 form a limiting accommodating space. When the display panel is placed into the packing container, the circuit board 40 can be placed within the limiting accommodating space, and so reduces its movable range. The stressing force exerted on the flexible printed circuit board 50 is then greatly minimized and its damage rate of the flexible printed circuit board 50 is therefore reduced.

In one embodiment as shown in FIG. 1 and FIG. 2, the limiting element 20 includes a first limiting component 21 and a second limiting component 22. The first limiting component 21 and the second limiting component 22 are disposed on the sidewall 1121 of the second receiving zone 112, and the first limiting component 21 is disposed opposite to the second limiting component 22 to form a limiting accommodating space.

Figure 3:
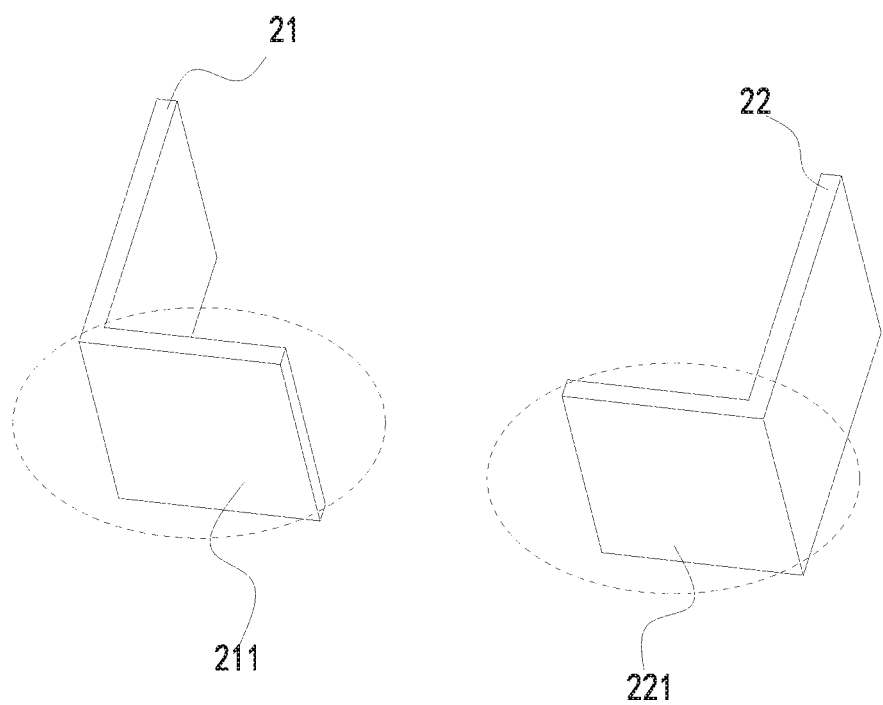
FIG. 3 is a schematic diagram showing a structure of a limiting element of the packing container in FIG. 1.

FIG. 3 is a schematic diagram showing the structure of the limiting element of the packing container in FIG. 1. One end of the first limiting component 21 away from the sidewall 1121 includes a bending portion 211 and one end of the second limiting component 22 away from the sidewall 1121 includes a bending portion 221. The bending directions of the bending portions 211 and 221 are toward the circuit board 40 to limit the vertical direction movement of the circuit board 40, which is the direction from the display panel main body 30 to the circuit board 40 or the direction vertical to the sidewall 1121 of the second receiving zone 112. Therefore, the flexible printed circuit board 50 would not be damaged because the excessive movement of the circuit board 40.

In one embodiment, the first limiting component 21 and the second limiting component 22 are engaged with the sidewall 1121 of the second receiving zone 112.

Figure 4:
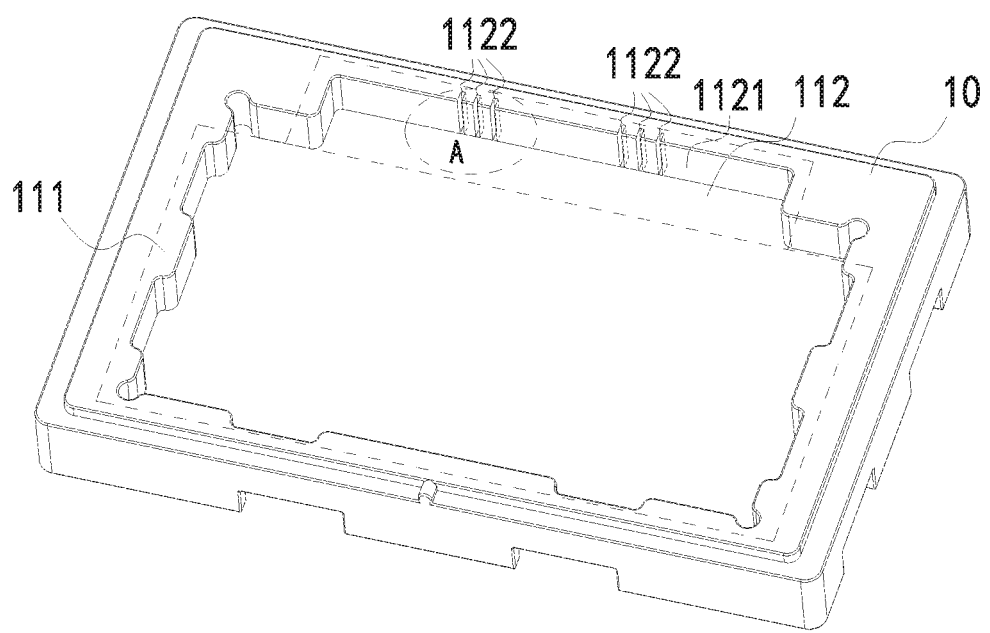
FIG. 4 is a schematic diagram of an embodiment showing a structure of a packing main body of a packing container for accommodating a display panel.

FIG. 4 is a schematic diagram of an embodiment showing the structure of the packing main body of the packing container. There are at least two first slots 1122 on the sidewall 1121 of the second receiving zone 112 to receive and secure one end of the first limiting component 21 and one end of the second limiting component 22, such that the first limiting component 21 and the second limiting component 22 can be installed on the sidewall 1121 of the second receiving zone 112.

As shown in FIG. 4, there are six first slots 1122 on the sidewall 1121 of the second receiving zone 112. These first slots are separately disposed and form two groups each with three slots. One group of the first slots 1122 is configured to lock the first limiting component 21, while the other group is configured lock the second limiting component 22. Having the first limiting component 21 and the second limiting component 22 to be received and locked in the different slots in each group, the distance between the first limiting component 21 and the second limiting component 22 can be adjusted to regulate the space of the limiting accommodating space for receiving various sizes of the circuit board 40.

Figure 5:
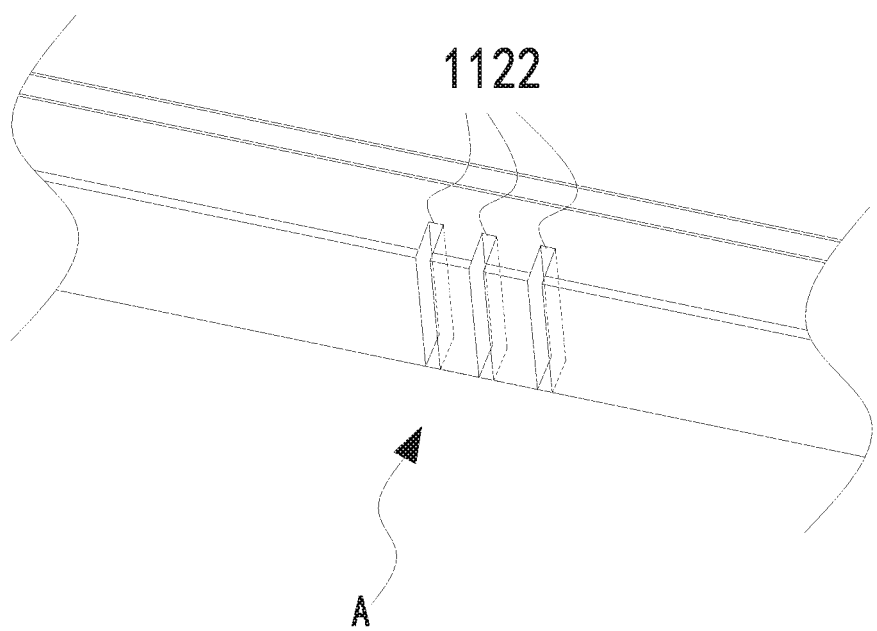
FIG. 5 is a close-up view of the portion A of the packing main body in FIG. 4.

FIG. 5 gives a close-up view of the circled portion A in FIG. 4 to better illustrate the structure of the first slot 1122 in this embodiment.

In other embodiments, the number and the arrangement of the first slots 1122 are not limited to those shown in FIG. 4 and FIG. 5. It is understood by one skilled in the art that the number of the first slots 1122 and their dispositions are not limited but only decided based on practical demands.

Figure 6:
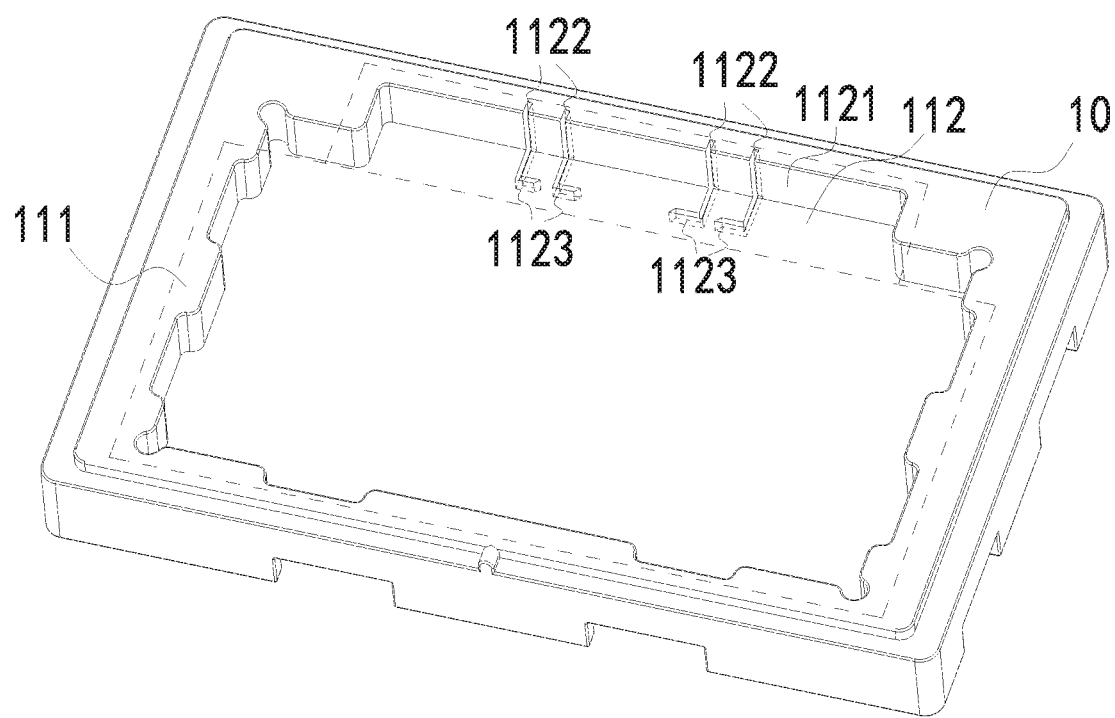
FIG. 6 is a schematic diagram of an embodiment showing a structure of a packing main body of a packing container for accommodating a display panel.

FIG. 6 is a schematic diagram showing a structure of a packing main body of a packing container for accommodating a display panel in the following embodiment. In order to securely dispose the first limiting component 21 and the second limiting component 22 on the second receiving zone 112, there are at least two second slots 1123 on the bottom surface of the second receiving zone 112.

The second slot 1123 is connected to the first slot 1122 and has its shape the same as the bottom of the first limiting component 21 and the bottom of the second limiting component 22 for receiving and locking the first limiting component 21 and the second limiting component 22, such that the first limiting component 21 and the second limiting component 22 can be firmly disposed on the second receiving zone 112.

In other embodiments, the second slot 1123 is not necessary connected to the first slot 1122, and the number of the second slot 1123 is not limited to four as in FIG. 6. There is no limitation applied on the number of the second slot 1123.

Figure 7:
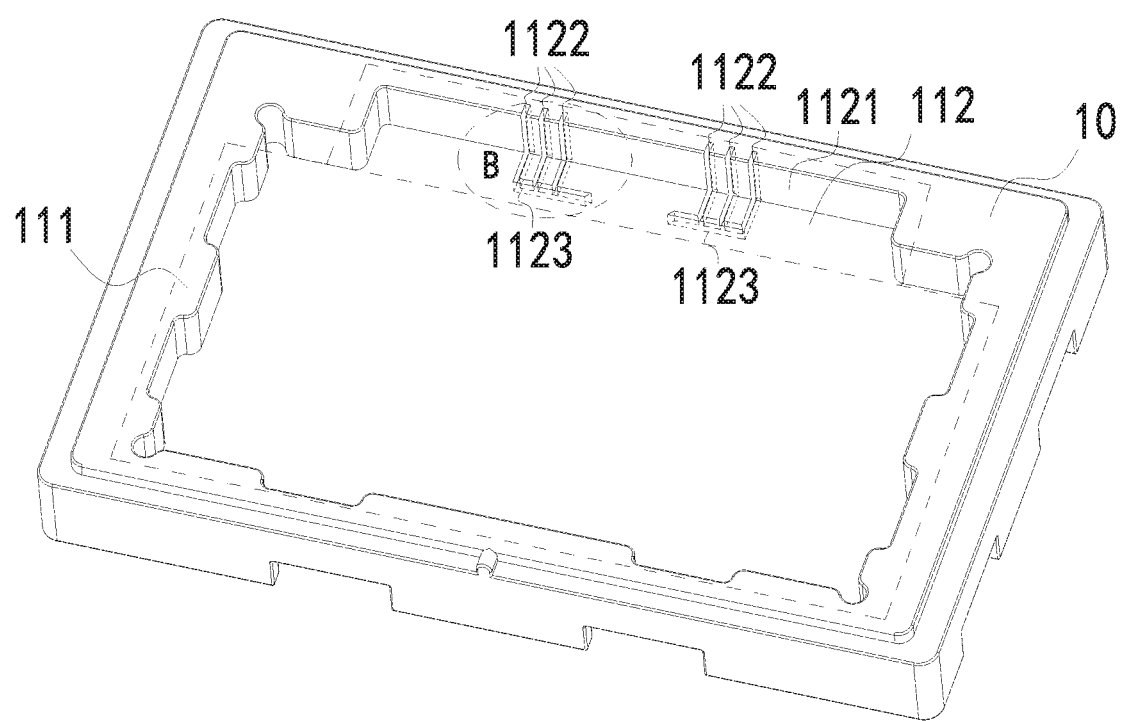
FIG. 7 is a schematic diagram of an embodiment showing a structure of a packing main body of a packing container for accommodating a display panel.
Figure 8:
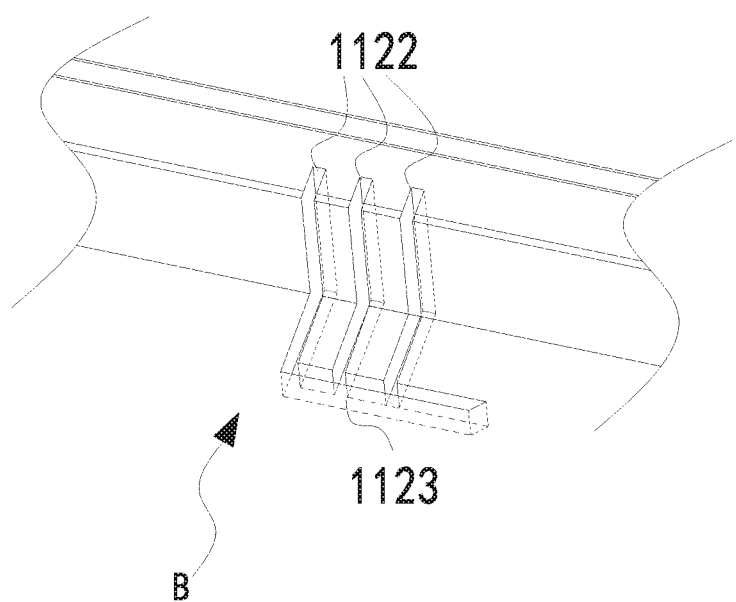
FIG. 8 is a close-up view of the portion B of the packing main body in FIG. 7.

The arrangement of the second slots 1123 is not limited to those shown in FIG. 6 as well. For instance, FIG. 7 is a schematic diagram of an embodiment showing a structure of a packing main body of a packing container for accommodating a display panel, and FIG. 8 is a close-up view of the portion B of the packing main body in FIG. 7. In the packing main body 10 as shown in FIG. 7 and FIG. 8, the total number of the second slots 1123 is six and is divided into two groups. Each group contains three second slots 1123. In each group, three second slots 1123 are communicating with one another.

Figure 9:
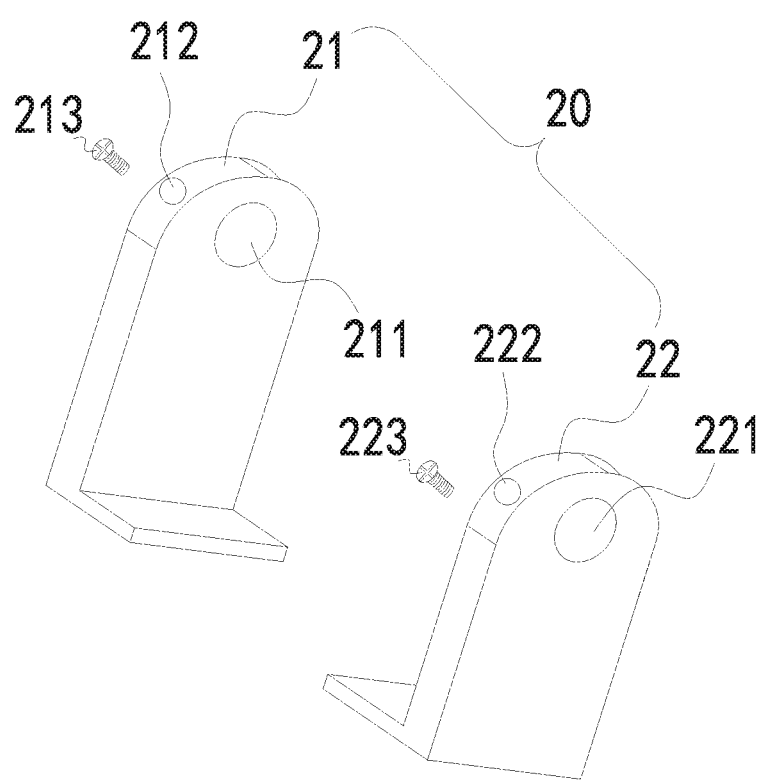
FIG. 9 is a schematic diagram of an embodiment showing a structure of a limiting element of a packing container for accommodating a display panel.
Figure 10:
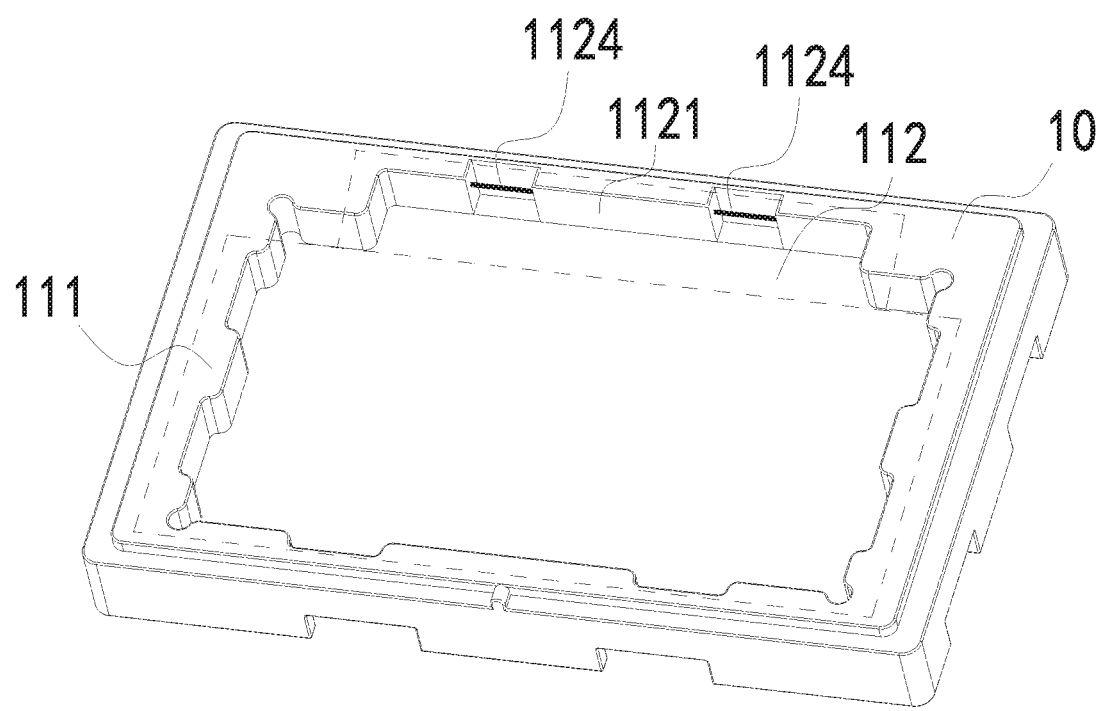
FIG. 10 is a schematic diagram of an embodiment showing a structure of a packing main body of a packing container for accommodating a display panel.

In another embodiment, the first limiting component 21 and the second limiting component 22 are disposed on the sidewall 1121 of the receiving recess 112 through rotation means as shown in FIG. 9 and FIG. 10.

FIG. 9 is a schematic diagram of an embodiment showing a structure of a limiting element of a packing container for accommodating a display panel, and FIG. 10 is a schematic diagram of the embodiment showing a structure of the packing main body of the packing container for accommodating a display panel. In this embodiment, a rotation ring 211 is disposed on one end of the first limiting component 21 and a rotation ring 221 is disposed on one end of the second limiting component 22. Corresponding rotation axles 1124 are arranged on the sidewall 1121 of the second receiving zone 112. The rotation ring 211 and the rotation ring 221 are coupled to and house the corresponding rotation axles 1124, and so install the first limiting component 21 and the second limiting component 22 on the sidewall 1121 of the second receiving zone 112.

The number of the rotation axle 1124 is two in the packing main body 10 as shown in FIG. 10, and these two axles are respectively corresponding to the first limiting component 21 and the second limiting component 22. In other embodiments, the number of the rotation axle 1124 can be one. In this case, the two rotation axles 1124 in FIG. 10 are connected to one another as one, and the rotation ring 211 of the first limiting component 21 and the rotation ring 221 of the second limiting component 22 are separately, with a certain space between them, coupled to and house the rotation axle 1124. However, there can be more rotation axle 1124 and the number of the rotation axle 1124 is not limited.

In one embodiment, in order to prevent the rotation ring 211 of the first limiting component 21 or the rotation ring 221 of the second limiting component 22 sliding or moving relatively to the corresponding rotation axle 1124, a fixing hole 212 and a fixing element 213 are disposed on the rotation ring 211 and a fixing hole 222 and a fixing element 223 on the rotation ring 221, as shown in FIG. 9.

The fixing element 213 is inserted through the fixing hole 212 and pressed against the rotation axle 1124 to fix the relative position between the first limiting component 21 and the rotation axle 1124. The fixing element 223 is inserted through the fixing hole 222 and pressed against the rotation axle 1124 to fix the relative position between the second limiting component 22 and the rotation axle 1124.

However, the installations of the first limiting component 21 and the second limiting component 22 on the sidewall 1121 of the second receiving zone 112 are not limited to those aforementioned locking and rotational measures. Other approaches that can attach and detach the limiting components can also be used. The installation of the first limiting component 21 and the second limiting component 22 are not necessary to be detachable and can be firmly fixed, through adhesive measure for instance, on the sidewall 1121 of the second receiving zone 112. The installation is not limited to these measures.

In some embodiments, the display panel main body 30 can be a liquid crystal display panel main body, an OLED display panel main body, a QLED display panel main body, a curved display panel main body, or any type of display panel main body. The type of the display panel main body is not limited to one of them.

In this embodiment, the limiting element 20 disposed on the second receiving zone 112, such that the limiting element 20 and the sidewall 1121 of the second receiving zone 112 together form a limiting accommodating space to constrain the circuit board 40, which effectively minimizes the movable space of the circuit board 40 in the packing container and reduces the stressing force of the circuit board 40 applied on a flexible printed circuit board 50 and cuts the failure rate of the flexible printed circuit board 50 during the transportation. Therefore, the production yield of the display panel is improved.

Figure 11:
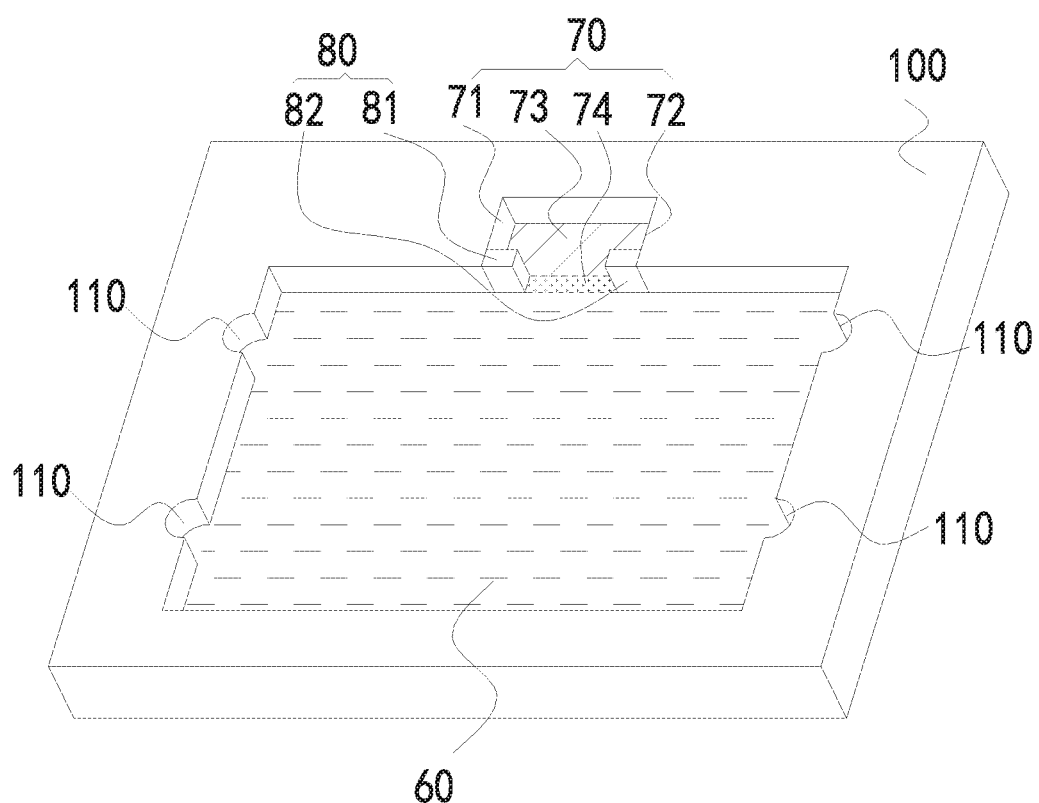
FIG. 11 is a schematic diagram of an embodiment in accordance with the present invention showing an alternative structure of a packing container for accommodating a display panel.

FIG. 11 is a schematic diagram of an embodiment showing an alternative structure of a packing container for accommodating a display panel. In some embodiments, the display panel can be a liquid crystal display panel, an OLED display panel, a QLED display panel, a curved display panel, or any type of display panel. The type of the display panel is not limited to one of them.

The display panel includes a display panel main body, a circuit board, and a flexible printed circuit board, wherein the display panel main body is connected to the circuit board through the flexible printed circuit board. The chip on film technology can be applied on the flexible printed circuit board. The display panel mentioned here is still an intermediate product, and, during the transportation, stressing forces thereby might be generated between the circuit board and the flexible printed circuit board and cause the damage of the flexible printed circuit board, which gives rise to concerns about abnormal issues of the display panel. Therefore, the present embodiment provides a packing container for accommodating the display panel to avoid the cause of the damage.

As shown in FIG. 11, the packing container includes a packing main body 100 and a limiting element 80. The packing main body 100 includes a receiving recess, which includes a first receiving zone 60 and a second receiving zone 70. The limiting element 80 includes a first limiting element 81 and a second limiting element 82. The packing container will be presented accompanied with the corresponding figure.

The first receiving zone 60 is configured to accommodate the display panel main body. In one embodiment, for easier putting in or taking out the display panel main body, one or more first recess portions 110 may be disposed with an interval therebetween on the sidewall of the first receiving zone 60.

There are four first recess portions 110 disposed on two opposite sidewalls of the first receiving zone 60, as shown in FIG. 11. In other embodiments, there may be more or less first recess portions 110, and the number of the first recess portions 110 is not limited. The shapes of the first recess portions 110 are not limited to those shown in FIG. 11 as well.

The second receiving zone 70 includes a first sidewall 71 and a second sidewall 72 facing to one another. A limiting element 80 is disposed on the second receiving zone 70. To be more specifically, the first limiting element 81 is disposed on the first sidewall 71, and the second limiting element 82 is disposed on the second sidewall 72.

In this embodiment, the first limiting element 81 and the second limiting element 82 are arranged opposite to one another, wherein the first limiting element 81 locates on an edge of the first sidewall 71 closer to the first receiving zone 60, and the second limiting element 82 locates on an edge of the second sidewall 72 closer to the first receiving zone 60.

The first limiting element 81, the second limiting element 82, the first sidewall 71, and the second sidewall 72 jointly form a first limiting zone 73, or the limiting element 80 and the sidewalls of the second receiving zone 70 form a limiting accommodating space to constrain the circuit board in the first limiting zone 73. Between the first limiting element 81 and the second limiting element 82 is a second limiting zone 74 configured to constrain the flexible printed circuit board. The movable space of the circuit board is then limited, and so reduces the stressing force of the circuit board exerted on the flexible printed circuit board. By this measure, the damage rate of the flexible printed circuit board is in check.

In other embodiments, the first limiting element 81 is not necessary directly opposite to the second limiting element 82, and the first limiting element 81 and the second limiting element 82 are not necessary disposed on the edges of the first and second sidewalls. These are not specifically limited in these embodiments.

In this embodiment, the first limiting element 81 is detachably disposed on the first sidewall 71, and the second limiting element 82 is detachably disposed on the second sidewall 72. To be more specifically as shown in FIG. 12 and FIG. 13, they are a schematic diagram showing a structure of the second limiting element of the packing container in FIG. 11 and a schematic diagram showing a structure of the second sidewall of the packing container in FIG. 11 respectively.

In this embodiment, an insert pin 821 is disposed on the second limiting element 82 and a cavity 721 on the edge of the second sidewall 72, wherein the insert pin 821 is introduced into the cavity 721 to fix the second limiting element 82 on the second sidewall 72.

An insert pin may also be disposed on the first limiting element 81 and a cavity on the first sidewall 71, wherein the structures of the insert pin and the cavity can be the same as the insert pin 821 on the second limiting element 82 and the cavity 721 on the second sidewall 72.

Figure 12:
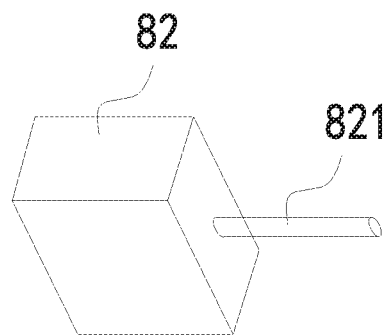
FIG. 12 is a schematic diagram showing a structure of a second limiting component of the packing container in FIG. 11.
Figure 13:
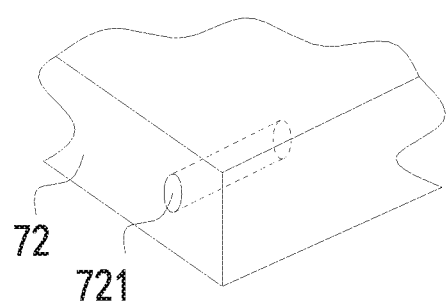
FIG. 13 is a schematic diagram showing a structure of a second sidewall of the packing container in FIG. 11.

The measure of detachable installation of the first limiting element 81 on the first sidewall 71 or the second limiting element 82 on the second sidewall 72 is not limited to the measure shown in FIG. 12 and FIG. 13. Any approach that can detachably install the first limiting element 81 or the second limiting element 82 on the first sidewall 71 or the second sidewall 72 respectively is also applicable.

In other embodiments, the first limiting element 81 and the first sidewall 71 may be integrally formed, and the second limiting element 82 and the second sidewall 72 may be integrally formed.

Figure 14:
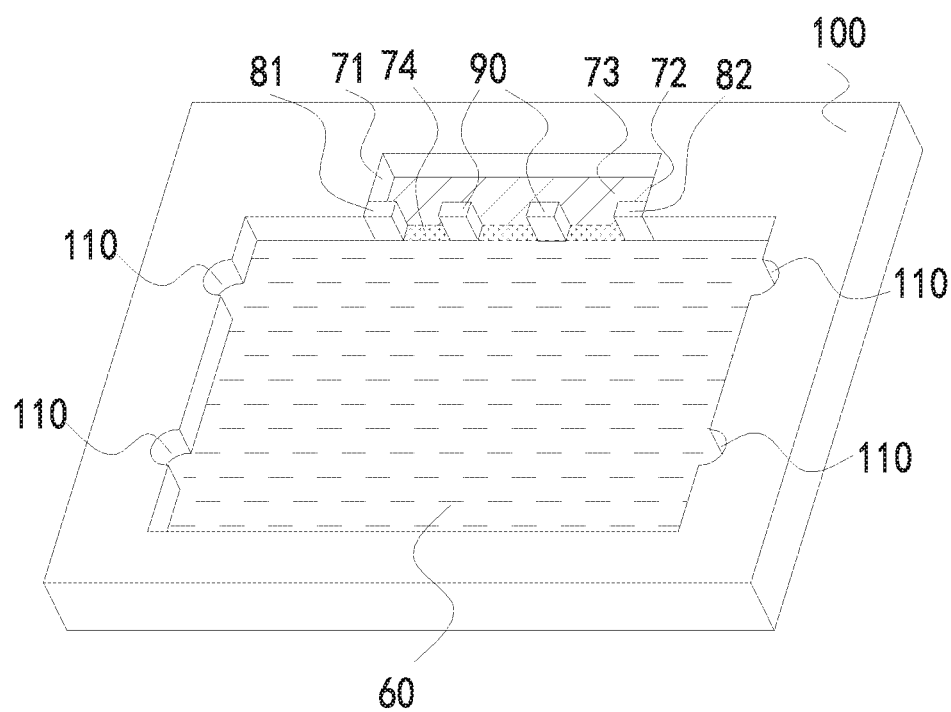
FIG. 14 is a schematic diagram of an embodiment in accordance with the present invention showing an alternative structure of a packing container for accommodating a display panel.

FIG. 14 is a schematic diagram of an embodiment showing an alternative structure of the packing container for accommodating a display panel. In this embodiment, one or more separators 90 are disposed on the bottom surface of the second limiting zone 74. The separators 90 divide the second limiting zone 74 into several limiting sub-zones, each of which may be configured to accommodate at least one flexible printed circuit board.

In FIG. 14, there are two separators 90, which divide the second limiting zone 74 into three limiting sub-zones. If each limiting sub-zone can accommodate one flexible printed circuit board, the packing container in FIG. 14 may accommodate a display panel having three flexible printed circuit boards.

In other embodiments, there may be one or more separators based on actual number of the flexible printed circuit boards. It is not limited to any specific number.

The separator 90 and the bottom surface of the second limiting zone 74 can be integrally formed, or the separator 90 can be detachably installed on the bottom of the second limiting zone 74. For example, several holes can be separately arranged on the bottom of the second limiting zone 74 and a pole is arranged on the bottom of the separator 90. By introducing the pole into the hole, the separator 90 can then be fixed on the bottom of the second limiting zone 74. The measure provides flexibility in number and locations of the separators 90 to meet practical requirements.

Figure 15:
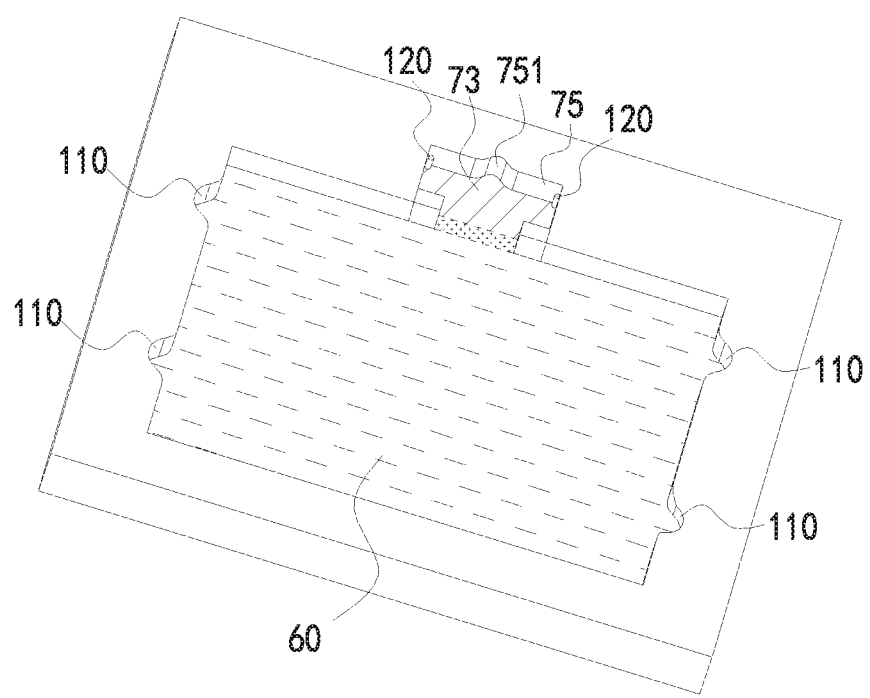
FIG. 15 is a schematic diagram of an embodiment in accordance with the present invention showing an alternative structure of a packing container for accommodating a display panel.

FIG. 15 is a schematic diagram of an embodiment showing an alternative structure of a packing container for accommodating a display panel. Numerous electronic components having various sizes are disposed on the circuit board. In order to avoid damaging them during the transportation of the display panel, one or more supporters 120 are disposed on the bottom surface of the second receiving zone 70.

When there is only one supporter 120, it can be arranged at the center of the bottom of the second receiving zone 70. The supporter 120 pins and holds the circuit board in the center.

In order to make the circuit board more balanced, four supporters 120 can be disposed at four corners of the bottom surface of the second receiving zone 70, as shown in FIG. 15. These supporters 120 contact four edges of the circuit board to support it. In other embodiments, the number of the supporter 120 depends on the structure of the circuit board and is adjustable based on practical requirements, and it is not limited to any specific number.

For easier putting in or taking out the circuit board, at least one second recess portion 751 may be configured on a third sidewall 75 of the second receiving zone 70 opposite to the second limiting zone 74.

In one embodiment, the depth of the second receiving zone 70 is typically greater than the depth of the first receiving zone 60, because numerous electronic components usually make the circuit board thicker than the display panel main body.

In this embodiment, the first limiting element 81 is disposed on the first sidewall 71 of the second receiving zone 70, and the second limiting element 82 is disposed on the second sidewall 72 of the second receiving zone 70, such that the first limiting element 81, the second limiting element 82, the first sidewall 71, and the second sidewall 72 jointly form the first limiting zone 73 to constraint the circuit board, which effectively minimizes the movable space of the circuit board in the packing container and reduces the stressing force of the circuit board exerted on the flexible printed circuit board, and so cuts the failure rate of the flexible printed circuit board during the transportation of the display panel. Therefore, the production yield of the display panel is improved.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A packing container for accommodating a display panel, comprising:
   a packing main body including a receiving recess, wherein the receiving recess includes a first receiving zone and a second receiving zone, the first receiving zone is configured to accommodate a display panel main body with a plurality of recess portions being disposed with an interval therebetween on a sidewall of the first receiving zone, and the second receiving zone is configured to accommodate a circuit board and a flexible printed circuit board, wherein the second receiving zone is disposed at one side of the first receiving zone; and
   a limiting element disposed on the second receiving zone, wherein the limiting element includes a first limiting component disposed on a sidewall of the second receiving zone away from the first receiving zone and a second limiting component disposed on the sidewall of the second receiving zone away from the first receiving zone;
   wherein the second limiting component is arranged to face the first limiting component, and the limiting element and the sidewall of the second receiving zone jointly form a limiting accommodating space to constrain the circuit board;
   wherein the first limiting component and the second limiting component are engaged with the sidewall of the second receiving zone, and at least two first slots are arranged on the sidewall of the second receiving zone, and the ends of the first and the second limiting components are engaged with the first slots.

2. The packing container of claim 1, wherein one end of each of the first limiting component and the second limiting component away from the sidewall includes a bending portion bending toward the limiting accommodating space.

3. The packing container of claim 1, wherein at least two second slots are arranged on a bottom surface of the second receiving zone, and base portions of the first limiting component and the second limiting component are engaged in the second slots.

4. The packing container of claim 3, wherein each of the at least two first slot and each of the at least two second slot are communicating with each other.

5. A packing container for accommodating a display panel, comprising:
   a packing main body having a receiving recess, the receiving recess including a first receiving zone configured to accommodate a display panel main body, and a second receiving zone configured to accommodate a circuit board and a flexible printed circuit board, wherein the second receiving zone is disposed at one side of the first receiving zone; and
   a limiting element disposed on a sidewall of the second receiving zone away from the first receiving zone;
   wherein the limiting element and the sidewall of the second receiving zone jointly form a limiting accommodating space to constrain the circuit board;
   wherein the limiting element includes:
   a first limiting component disposed on the sidewall of the second receiving zone away from the first receiving zone; and
   a second limiting component disposed on the sidewall of the second receiving zone away from the first receiving zone, the first limiting component being disposed to face the first limiting component to form the limiting accommodating space;
   wherein the first limiting component and the second limiting component are engaged with the sidewall of the second receiving zone, and at least two first slots are arranged on the sidewall of the second receiving zone, and the ends of the first and the second limiting components are engaged with the at least two first slots.

6. The packing container of claim 5, wherein one end of each of the first limiting component and the second limiting component away from the sidewall includes a bending portion bending toward the limiting accommodating space.

7. The packing container of claim 5, wherein at least two second slots are arranged on a bottom surface of the second receiving zone, and base portions of the first limiting component and the second limiting component are engaged with the at least two second slots.

8. The packing container of claim 5, wherein a plurality of recess portions are disposed with an interval therebetween on a sidewall of the first receiving recess.

* * * * *